United States Patent
Wöelfel

(10) Patent No.: US 8,481,897 B2
(45) Date of Patent: Jul. 9, 2013

(54) PRINTED CIRCUIT BOARD OR CARD COMPRISING A HEATING WIRE

(75) Inventor: Markus Wöelfel, Eckental (DE)

(73) Assignee: Jumatech, GmbH (DE)

( * ) Notice: Subject to any disclaimer, the term of this patent is extended or adjusted under 35 U.S.C. 154(b) by 0 days.

(21) Appl. No.: 11/814,393

(22) PCT Filed: Jan. 24, 2006

(86) PCT No.: PCT/EP2006/000614
§ 371 (c)(1),
(2), (4) Date: Oct. 18, 2007

(87) PCT Pub. No.: WO2006/077165
PCT Pub. Date: Jul. 27, 2006

(65) Prior Publication Data
US 2008/0105670 A1 May 8, 2008

(30) Foreign Application Priority Data
Jan. 24, 2005 (DE) .................... 20 2005 001 163 U

(51) Int. Cl.
| H05B 3/16 | (2006.01) |
| H05B 3/22 | (2006.01) |
| H05K 1/00 | (2006.01) |
| H05K 1/18 | (2006.01) |

(52) U.S. Cl.
USPC ............ 219/543; 219/209; 219/544; 219/548

(58) Field of Classification Search
USPC ... 219/543, 544, 546, 547, 548, 307; 338/307
See application file for complete search history.

(56) References Cited

U.S. PATENT DOCUMENTS

| 3,440,407 | A | | 4/1969 | Goltsos et al. | |
| 4,374,316 | A | * | 2/1983 | Inamori et al. | 219/209 |
| 4,450,623 | A | | 5/1984 | Burr | |
| 4,627,162 | A | | 12/1986 | Holt | |
| 4,769,525 | A | * | 9/1988 | Leatham | 219/209 |
| 4,950,868 | A | * | 8/1990 | Moss et al. | 219/211 |
| 5,624,750 | A | * | 4/1997 | Martinez et al. | 219/543 |
| 6,114,674 | A | * | 9/2000 | Baugh et al. | 219/543 |
| 6,184,494 | B1 | * | 2/2001 | Isokoski et al. | 219/209 |

(Continued)

FOREIGN PATENT DOCUMENTS

| AU | 728378 B2 | 7/1998 |
| DE | 4221454 A1 | 3/1994 |

(Continued)

OTHER PUBLICATIONS

DE-19618917 C1, Woefel et al, Oct. 1997, "Resin Sealed Wired Circuit Board Manufacturing Method," partial translation.*

(Continued)

Primary Examiner — Joseph M Pelham
(74) Attorney, Agent, or Firm — Cantor Colburn LLP

(57) ABSTRACT

A printed circuit board or card (1) has an electric circuit (1a) and at least one electrically insulated conductive heating wire (2), the heating wire (2) being wire-printed on or in the printed circuit board or card. Heating wire (2) can be connected at connection points (4) to a voltage source (not shown) to be provided on or in the printed circuit board or card (1).

10 Claims, 2 Drawing Sheets

U.S. PATENT DOCUMENTS

| | | | |
|---|---|---|---|
| 6,262,392 B1 * | 7/2001 | Morton et al. | 219/209 |
| 6,396,706 B1 * | 5/2002 | Wohlfarth | 361/760 |
| 6,483,078 B2 * | 11/2002 | Sullivan | 219/209 |
| 6,492,620 B1 * | 12/2002 | Lau | 219/209 |
| 6,541,736 B1 | 4/2003 | Huang et al. | |
| 6,621,055 B2 | 9/2003 | Weber et al. | |
| 6,841,739 B2 * | 1/2005 | Moore | 174/255 |
| 2001/0014212 A1 * | 8/2001 | Rutherford | 392/503 |
| 2002/0038797 A1 * | 4/2002 | Friedrich et al. | 219/209 |
| 2002/0162829 A1 * | 11/2002 | Weber et al. | 219/209 |
| 2002/0170901 A1 * | 11/2002 | Lau | 219/209 |
| 2003/0107556 A1 | 6/2003 | Yamashita | |
| 2003/0127445 A1 * | 7/2003 | Oguma et al. | 219/209 |
| 2004/0020687 A1 * | 2/2004 | Moore | 174/254 |
| 2004/0075528 A1 * | 4/2004 | Carbin et al. | 338/307 |
| 2006/0231541 A1 * | 10/2006 | Takada et al. | 219/209 |

FOREIGN PATENT DOCUMENTS

| | | |
|---|---|---|
| DE | 4318327 A1 | 12/1994 |
| DE | 19618917 C1 | 10/1997 |
| DE | 19851172 A1 | 5/2000 |
| DE | 20120349 U1 | 4/2002 |
| GB | 2038102 A * | 7/1980 |
| GB | 2330289 A * | 4/1999 |
| JP | 02245678 A * | 10/1990 |
| JP | 06243954 A * | 9/1994 |
| JP | 2000-91714 A | 3/2000 |
| JP | 2001-508942 A | 7/2001 |
| JP | 2003-234045 A | 8/2003 |
| WO | 98/30075 A2 | 7/1998 |

OTHER PUBLICATIONS

International Search Report for International Application No. PCT/EP2006/000614, mailed Apr. 6, 2006, 3 pages.
English Language Abstract of DE 19 61 8917 C1.
English Language Abstract of DE 19 85 1172 A1.
English Language Abstract of DE 42 21 454 A1.
English Language Abstract of DE 43 18 327 A1.
International Preliminary Report on Patentability for PCT/EP2006/000614, international filing date of Jan. 24, 2006, mailed Jul. 24, 2007, 6 pages.
Written Opinion for PCT/EP2006/000614, international filing date of Jan. 24, 2006, 5 pages.
English translation of official action dated Jan. 17, 2012, in corresponding Japanese Patent Application No. 2007-551636, 3 pages.

* cited by examiner

PRINTED CIRCUIT BOARD OR CARD COMPRISING A HEATING WIRE

CROSS-REFERENCE TO RELATED APPLICATIONS

Not Applicable.

STATEMENT REGARDING FEDERALLY SPONSORED RESEARCH OR DEVELOPMENT

Not Applicable.

THE NAMES OF THE PARTIES TO A JOINT RESEARCH AGREEMENT

Not Applicable.

INCORPORATION-BY-REFERENCE OF MATERIAL SUBMITTED ON A COMPACT DISC

Not Applicable.

BACKGROUND OF THE INVENTION

1. Field of the Invention

The invention relates to a printed circuit board or card comprising an electric circuit and an insulated heating wire.

When such printed circuit boards are arranged in electric devices which are located outdoors, they are often exposed to severe temperature changes. This can lead to the formation of condensation water and therefore to short circuits within the electric circuit. Furthermore, the printed circuit board can expand in various ways according to the fluctuating temperatures, which can give rise to short circuits or contact separations in the electric circuit.

2. Description of Related Art

A method for producing a wire-printed printed circuit board or card is known, for example, from DE 196 18 917 C1.

BRIEF SUMMARY OF THE INVENTION

The object of the invention under consideration is therefore to further develop a printed circuit board or card of the type mentioned above that largely avoids the disadvantages described above.

This object is solved in accordance with the present invention by a printed circuit board or card comprising an electric circuit and, in addition to and separate from the electric circuit, at least one electrically conductive heating wire having electrical insulation. The heating wire is arranged on or in the printed circuit board or card, and is connectible to a voltage source and is attached to the printed circuit board or card by means of wire-printing.

Another aspect of the present invention provides that the heating wire, which may be formed by a resistance wire, is arranged between the printed circuit board or card and a layer of insulating compound disposed in a wiring level.

Other aspects of the present invention provide one or more of the following features: the heating wire may essentially extend across the entire surface of the printed circuit board or card in a meandering way; the heating wire may connect to one another connection points that are arranged on the printed circuit board or card and connection points for the voltage source; and the heating wire may be formed by a resistance wire.

The invention is based on the idea that at least one electrically conductive heating wire that can be connected to a voltage source is arranged on or in the printed circuit board or card. In this way, the card or printed circuit board can be constantly kept at a defined temperature by heating. The level of this temperature is coordinated to the particular case, and should not interfere with the function of the electric circuit and particularly that of its electric and electronic components. As a result of the heating, formation of condensation water and strongly changing thermal expansion of the printed circuit board or card are largely avoided, so that the circuit's susceptibility to faults is advantageously reduced.

Advantageous further developments and improvements of the present invention are possible as described below.

Particularly preferably, the heating wire is attached to the printed circuit board or card by means of wire-printing. While strip conductors on cards or printed circuit boards are normally manufactured by means of an etching process, i.e., the areas between desired strip conductors are etched away from copper film that has been applied to a support board, in the case of wire-printed circuit boards or cards, conductors made of an electrically conductive material are laid between connection points of the card arranged on the card and, for example, moulded into a block of an insulating compound together with the card in a sandwich structure.

A particularly uniform temperature distribution results if the heating wire essentially extends across the entire surface of the printed circuit board or card in a meandering way.

Particularly preferably, the heating wire is formed by a resistance wire and connects to one another connection points that are arranged on the printed circuit board or card to connection points for the voltage source.

BRIEF DESCRIPTION OF THE SEVERAL VIEWS OF THE DRAWINGS

In the following, an embodiment of the invention is depicted in the drawings and explained in more detail in the subsequent description. Shown in the drawings are.

DETAILED DESCRIPTION OF THE INVENTION

Figure 1:
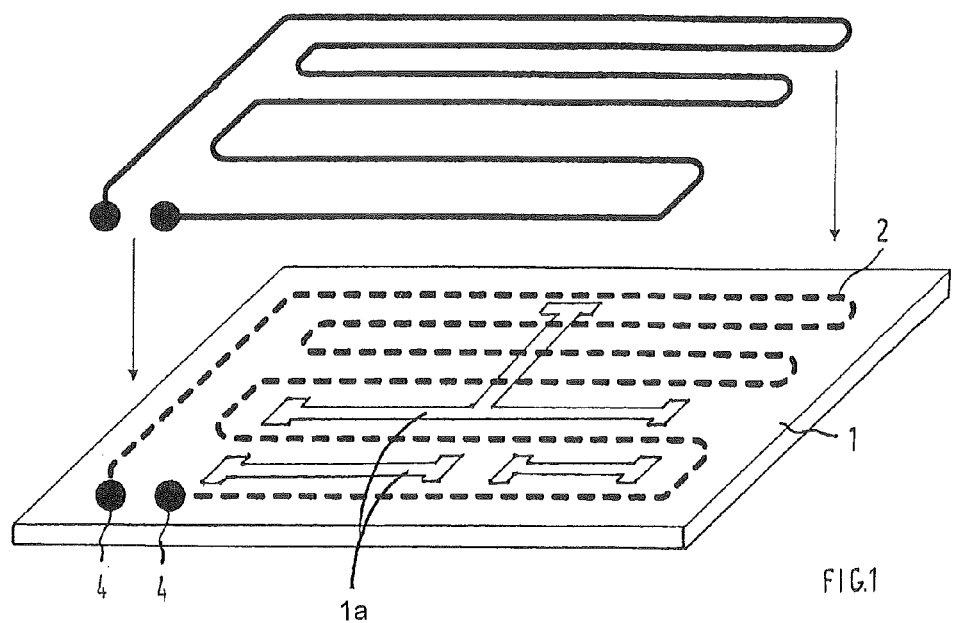
FIG. 1 is a perspective view of a printed circuit board, on which an electrically conductive heating wire is to be applied according to a first manufacturing step.

The electrically insulating printed circuit board indicated as a whole as 1 in FIG. 1 is preferably an etched printed circuit board, i.e., located on its surface are flat strip conductors 1a made of copper, preferably developed by means of etching, which form an electric circuit.

According to a first manufacturing step, shown schematically in FIG. 1, an electrically conductive conductor, for example, in the form of a heating resistance wire 2, is applied to the printed circuit board 1 by means of wire-printing. The application of a conductor on to a printed circuit board 1 by means of wire-printing is known, for example, from the above-mentioned DE 196 18 917 C1. In the case at hand, therefore, a combination of etched strip conductors 1a with a heating resistance wire 2 is realised on the printed circuit board 1.

This wire 2 can be a wire with an electrically insulating layer or one without an electrically insulating layer. An electrically insulated wire is particularly suitable for laying the heating wire in a meandering manner if the heating wire and the strip conductors are arranged on the same side of the printed circuit board. In this way, the manufacture can be simplified and unwanted electrical contact between the heating wire and the strip conductor can be avoided. Preferably, the wire is not insulated if the wire and strip conductors are arranged on different sides of the printed circuit board. If the strip conductors and heating wire are arranged on the same side of the printed circuit board, a non-electrically insulated heating wire can nevertheless be used if it is possible to ensure a distance between the strip conductor and the heating wire. The heating wire 2 should preferably be kept at a distance from the strip conductor 1a perpendicular to the two-dimensional extension of the printed circuit board. The distance here should naturally be selected in such a way that the total thickness of the completed printed circuit board does not become too large, but still just large enough that sufficient electrical insulation is insured. In the preferred embodiment, the strip conductor and the heating wire cross over each other in a top view of the printed circuit board or are arranged at a distance from each other, one on top of the other, perpendicularly to the two-dimensional extension of the printed circuit board.

Figure 2:
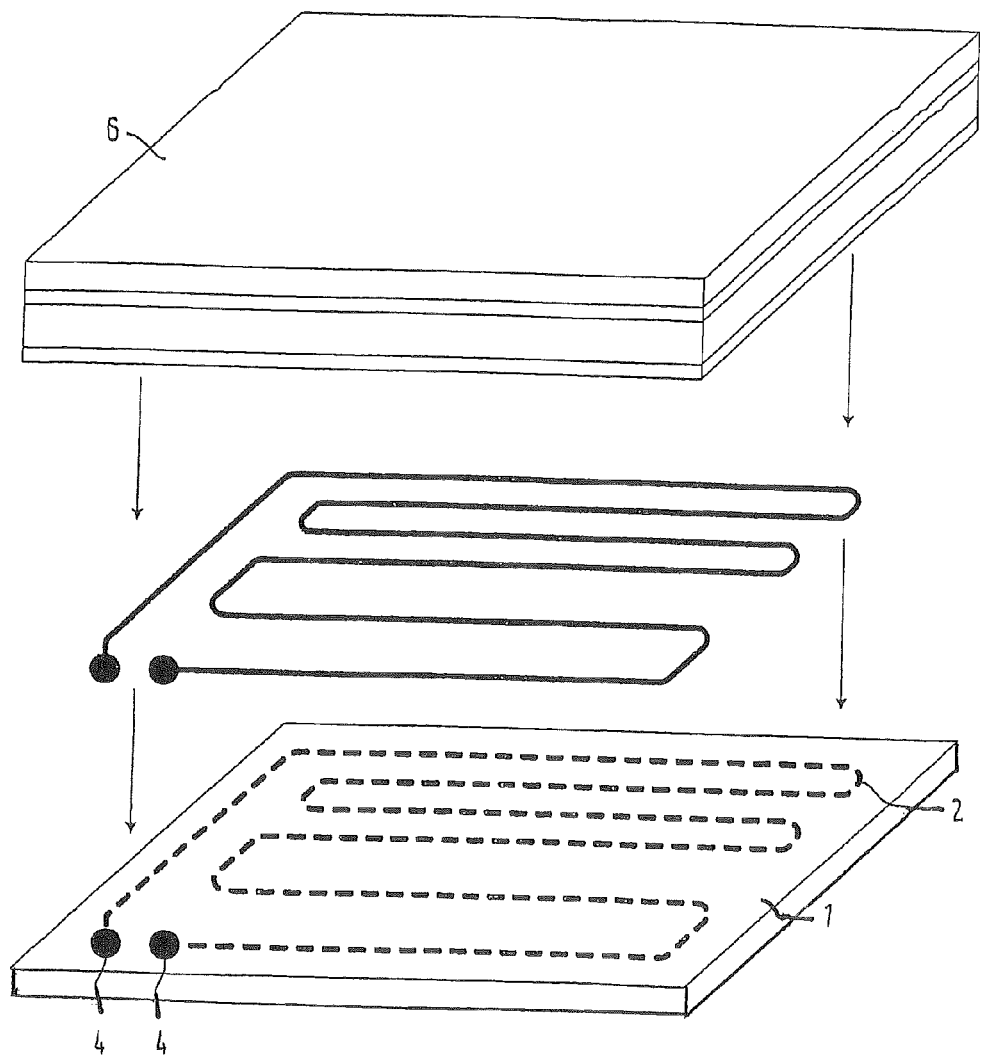
FIG. 2 is a perspective view of the printed circuit board of FIG. 1 with the electrically conductive heating wire, on to which a covering insulation layer is applied according to a further manufacturing step.

A further manufacturing step is shown in FIG. 2. (The etched strip conductors 1a are omitted from FIGS. 2 and 3 for clarity of illustration.) In FIG. 2, the ends of the heating resistance wire 2 are connected to, for example, two connection points 4 arranged on a side surface of the printed circuit board 1, preferably by means of welding, by means of which it is possible to create a connection to an external voltage source. The voltage source can, however, also be arranged directly on the printed circuit board 1, e.g., in the form of a rechargeable battery.

Figure 3:
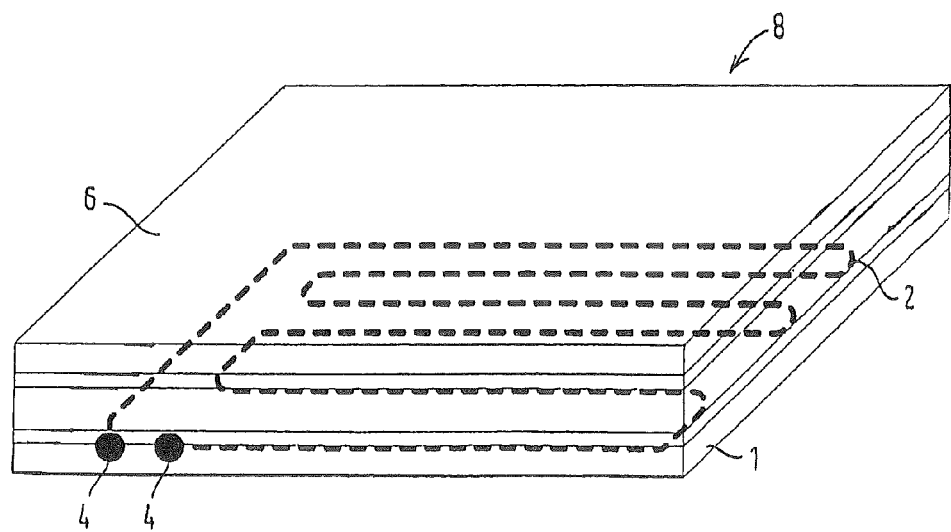
FIG. 3 is a perspective view of the printed circuit board of FIG. 1 in the completed state.

After this, preferably one or more covering layers 6 made of an insulating compound are applied to the printed circuit board 1 that is connected to the heating resistance wire 2, for example, by casting an insulating compound that can be hardened into a casting mould holding the printed circuit board 1. In this way, a sandwich body 8 results, in which the printed circuit board 1 is integrally connected to the covering layer 6 and the heating resistance wire 2 is held in position in a wiring level between these, as can be seen in FIG. 3. The heating wire is, so to speak, arranged in its own layer. Alternatively, the heating wire can also be laid in the printed circuit board only in areas, in order to heat structural components selectively.

Particularly preferably, the heating resistance wire 2 essentially extends across the entire surface of the printed circuit board 1 in a meandering way. In the case at hand, therefore, a combination of an electric circuit in the form of etched strip conductors 1a (FIG. 1) with a heating resistance wire 2 is realised on the printed circuit board 1. According to a further embodiment, the electric circuit could also be realised by conductors, however, which then run between the connection points arranged on the printed circuit board 1 for the electronic components of the circuit.

According to an alternate method, the etching of the copper film attached to the surface of the printed circuit board 1 can also always be done after the laying or wire-printing of the heating resistance wires 2, in order to work the connection points 4 out of the copper film. Because these are, however, already known ahead of time according to the existing circuit layout, the connections of the heating resistance wires 2 and connection points 4, which do not actually exist at the time, can already be produced in advance. Furthermore, the surface of the printed circuit board 1 provided with the heating resistance wires 2 can be provided with the covering layer 6 by means of pressing a prepreg made of an insulating compound to the printed circuit board 1.

The invention claimed is:

1. A printed circuit board or card comprising an electric circuit and, in addition to and separate from the electric circuit, at least one electrically conductive heating wire that is arranged on or in the printed circuit board or card, the heating wire: (i) being connectible to a voltage source, (ii) comprising a wire-printed heating wire, and (iii) having electrical insulation thereon.

2. In a printed circuit board or card comprising an electric circuit and additionally having at least one electrically conductive heating wire which (a) is arranged on or inside the printed circuit board or card, (b) is connectible to a voltage source, and (c) comprises a wire-printed heating wire, the improvement comprising that the heating wire is electrically insulated.

3. The printed circuit board or card according to claim 1 or claim 2, wherein the heating wire is sandwiched between the printed circuit board or card and a layer of insulating compound in a wiring level.

4. The printed circuit board or card according to claim 3, wherein the heating wire comprises a resistance wire.

5. The printed circuit board or card according to claim 1 or claim 2, wherein the heating wire essentially extends across the entire surface of the printed circuit board or card in a meandering way.

6. The printed circuit board or card according to claim 5, wherein the heating wire comprises a resistance wire.

7. The printed circuit board or card according to claim 1 or claim 2, wherein the heating wire connects to one another connection points that are arranged on the printed circuit board or card and connection points for the voltage source.

8. The printed circuit board or card according to claim 7, wherein the heating wire comprises a resistance wire.

9. The printed circuit board or card according to claim 1 or claim 2, wherein the heating wire comprises a resistance wire.

10. The printed circuit board or card according to claim 2, wherein the heating wire comprises a resistance wire.

* * * * *